US006829730B2

(12) United States Patent
Nadeau-Dostie et al.

(10) Patent No.: US 6,829,730 B2
(45) Date of Patent: Dec. 7, 2004

(54) METHOD OF DESIGNING CIRCUIT HAVING MULTIPLE TEST ACCESS PORTS, CIRCUIT PRODUCED THEREBY AND METHOD OF USING SAME

(75) Inventors: Benoit Nadeau-Dostie, Aylmer (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 788 days.

(21) Appl. No.: 09/843,307

(22) Filed: Apr. 27, 2001

(65) Prior Publication Data

US 2002/0184562 A1 Dec. 5, 2002

(51) Int. Cl.⁷ .................................................. G06F 11/27
(52) U.S. Cl. ............................ 714/30; 714/31; 714/724; 714/729; 714/734; 716/1
(58) Field of Search ............................ 714/25, 30, 31, 714/37, 38, 724, 727, 729, 733, 734; 703/23, 24, 25, 26, 27, 28; 716/1, 4

(56) References Cited

U.S. PATENT DOCUMENTS

| | | | |
|---|---|---|---|
| 5,884,023 A | | 3/1999 | Swoboda et al. |
| 6,073,254 A | | 6/2000 | Whetsel |
| 6,115,763 A | * | 9/2000 | Douskey et al. ............. 714/727 |
| 6,324,662 B1 | * | 11/2001 | Haroun et al. .............. 714/724 |
| 6,385,749 B1 | * | 5/2002 | Adusumilli et al. ........... 714/30 |
| 6,408,413 B1 | * | 6/2002 | Whetsel ....................... 714/727 |
| 6,425,100 B1 | * | 7/2002 | Bhattacharya ................ 712/38 |

OTHER PUBLICATIONS

Alves, G.R. et al., Using the BS Register for Capturing and Storing n–bit Sequences in Real Time, IEEE Proceeding of the European Test Workshop. May 1999. pp. 130–135.
Hamilton, C. et al., Methods for Boundary Scan Access of Built–In Self–Test for Field Programmable Gate Arrays. IEEE Proceedings of Southeastcon. Mar. 1999. pp. 69–78.
Steven F. Oakland, "Considerations for Implementing IEEE 1149.1 On System–on–a–Chip Integrated Circuits", International Test Conference 2000 Proceedings, Oct. 3–5, 2000, p. 628–637.
Lee Whetsel, "An IEEE Based Test Access Architecture for ICs With Embedded Cores", International Test Conference 1997 Proceedings, Nov. 1–6, 1997.

* cited by examiner

*Primary Examiner*—Robert Beausoliel
(74) *Attorney, Agent, or Firm*—Eugene E. Proulx

(57) ABSTRACT

In a circuit with multiple Test Access Port (TAP) interfaces, the TAPs are arranged into groups, with secondary TAPs in one or more groups and a master TAP in another group, the master TAP having an instruction register with bits for storing a group selection code; a Test Data Output (TDO) circuit responsive to the group selection code connects the group TDO of one of the groups to the circuit TDO; and, for each secondary TAP group, a group Test Data Input (TDI) circuit responsive to a shift state signal for selectively connecting the group TDI to the circuit TDI or to the output of a padding register having its input connected to the circuit TDI, and its output connected to an input of the group TDI circuit; and a group TMS circuit responsive to a predetermined TAP selection code associated with the group for producing a group TMS signal for each TAP in the group.

51 Claims, 6 Drawing Sheets

NOTE: The values adjacent to each state transition correspond to TMS.

METHOD OF DESIGNING CIRCUIT HAVING MULTIPLE TEST ACCESS PORTS, CIRCUIT PRODUCED THEREBY AND METHOD OF USING SAME

The present invention relates, in general, to integrated circuits and, more specifically, to the design of integrated circuits having multiple Test Access Port (TAP) interfaces, a novel circuit, method of and program product for designing such circuits.

BACKGROUND OF THE INVENTION

Test Access Port (TAP) interfaces are used to perform test and debug operations on a circuit. A TAP includes an instruction register, at least one data register, and a test bus which includes a Test Clock input (TCK), a Test Mode Select (TMS) input, a Test Reset input (TRSTN), a Test Data Input (TDI) and a Test Data Output (TDO). A simple serial protocol, such as the IEEE 1149.1 protocol illustrated in FIG. 5, is used to access the various test and instruction registers in a TAP.

Most integrated circuits require only one TAP. However, there are a number of situations in which more than one TAP are present on a chip. Embedded processor cores often include debug registers that can be accessed through a TAP under the control of a software development system. More than one such embedded core can be used on the same chip. Most current software development systems assume that all TAPs are connected in a daisy-chain fashion in which the TDI of each TAP is connected to the TDO of the preceding TAP in the chain. The TDI of the first TAP in a chain is connected to the TDI of the circuit and the TDO of the last TAP in a chain is connected to the TDO of the circuit. The TAPs share the test clock input, the TMS input and the TRSTN input. An additional TAP is usually required to control all circuit test operations and a Boundary Scan test data register. However, in other situations, test data registers might need to be shared.

These TAPs are preferably controlled from the same test bus such as the IEEE 1149.1 standard. The circuit as a whole should be compliant with the standard. It is also necessary to ensure that all of these TAPs are connected in a way that is compatible with existing software development systems. Another constraint is that existing TAPs usually cannot be modified to accommodate a specific circuit context.

Several techniques have been proposed to handle the presence of several TAPs in a circuit. In a paper entitled "An IEEE 1149.1 Based Test Access Architecture for ICs With Embedded Cores", IEEE International Test Conference, 1997, pp. 69–78, incorporated herein by reference, Whetsel L. proposes three techniques. The first technique consists of connecting the TAPs in a single daisy-chain. This technique results in a circuit which is not compliant with the standard. The second technique consists of selecting the TAPs using compliance enable inputs of the circuit. One combination of inputs selects the TAP that is responsible for all boundary scan operations related to the standard. This method requires additional inputs beyond of the five inputs required by the standard and the number of inputs increases with the number of TAPs. These inputs are not compatible with most software development systems. The third technique, which is also described in Whetsel U.S. Pat. No. 6,073,254 granted on Jun. 6, 2000 for "Selectively Accessing Test Access Ports in a Multiple Test Access Port Environment", incorporated herein by reference, provides a register for performing data transfer operations between the test bus and the TAPs. The method requires modification of the existing TAPs to generate a select output connected to the register and to accept an enable output generated by the register. Clearly, none of these methods meet the constraints set out earlier.

Oakland (Oakland S., "Considerations for Implementing IEEE 1149.1 on System-on-a-Chip Integrated Circuits", IEEE International Test Conference, 2000, pp. 628–637), incorporated herein by reference, proposes two variations of the same technique. While the technique meets the constraints mentioned earlier, it possesses a number of limitations that are not desirable. According to the first variation of the technique, whenever an instruction needs to be shifted into any of the TAPs, the instruction register of all TAPs are concatenated to form a single instruction. The length of the instructions to be shifted in can become excessively long. Also, it is not possible to perform a structural test of the embedded TAPs. Finally, it is very difficult to diagnose problems because the instruction register is distributed throughout the chip. The second variation of the technique addresses the last two limitations by providing shadow registers for all instruction registers of the embedded TAPs. However, it is not possible to access the information captured by the instruction registers of the embedded TAPs during the Capture-IR state. There is also an additional cost in silicon area due to the shadow registers.

SUMMARY OF THE INVENTION

The present invention seeks to provide a novel, multiple TAP circuit architecture and a method of designing a circuit containing a plurality of TAPs which is compliant with the standard, which does not require modification of any of the embedded TAPs and which can be structurally tested, any which can effectively control any or all of the TAPs without the need for non-standard signals.

The present invention provides a Master TAP which functions as the circuit test bus for controlling data transfer operations with the remaining, secondary TAPs in the circuit. The secondary TAPs are connected between the circuit TDI and circuit TDO in one or more TAP groups. A selection code, stored in the Master TAP instruction register and loaded with each instruction, specifies the next TAP group which will be involved in a data transfer operation. A TDO selector responds to the selection code by connecting the group TDO of the specified group to the circuit TDO. A group TDI selector is provided for each secondary TAP group. The group TDI selectors are responsive to a shift state signal and operate to connect either the circuit TDI or the output of a padding register to the group TDI of their associated TAP group. The Master TAP produces a TMS signal for each TAP group under the control of the selection code. The TAP group specified by the selection code receives the TMS pulses applied to the circuit TMS pin. The remaining TAP groups receive an inactive TMS signal and are, thus, kept inactive. Except for connecting their test interface connections to the output of the Master TAP, none of the existing TAPs require any modification to accommodate the present invention. To simplify instruction loading operations, the length of the TDI-TDO path through each TAP group is the same for all groups, including the Master TAP group. The padding register may form part of the Master TAP instruction register or may be a separate register for each TAP group.

One aspect of the present invention is defined as a circuit having a plurality of Test Access Port interfaces, each interface having test connections including a Test Data Input a Test Data Output a Test Mode Select input, a Test Clock Input and a Test Reset input an instruction register and at least one test data register, comprising: one of the TAPs having test connections serving as a circuit test interface, the one TAP having: an instruction register having a length equal to the length of the longest instruction register plus a predetermined number of bits for storing a TAP selection code for selecting one of the TAPs; a TDO circuit responsive to the TAP selection code for selectively connecting the TDO of one of the TAPs to the circuit TDO; and the one TAP further including, for each other TAP in the circuit: a padding register having a length equal to the length of the instruction register of the one TAP less the length of the instruction register of the each other TAP and having an input connected to the circuit TDI, and an output; a TMS circuit responsive to a predetermined TAP selection code associated with the each other TAP and a TMS signal applied to a circuit TMS input for producing a TAP TMS signal for the each other TAP; and a TDI circuit responsive to a shift state signal for selectively connecting the TDI of the other TAP to the circuit TDI or to the output of the padding register.

Another aspect of the present invention is defined as a method of designing a circuit containing a plurality of Test Access Port interfaces, each the TAP having a Test Data Input a Test Data Output a Test Mode Select input, a Test Clock Input and a Test Reset input, an instruction register and at least one test data register, the method comprising the steps of providing a master TAP for at least controlling data transfer operations with other TAPs in the circuit; connecting master TAP test inputs and output to corresponding circuit test inputs and outputs; adding to the master TAP, an instruction register having a length equal to the length of the longest instruction register of each other TAP plus a predetermined number of bits for storing a TAP selection code for selecting one of the TAPs; a TDO circuit responsive to the TAP selection code for selectively connecting the TDO of one of the TAPs to the circuit TDO; and for each other TAP: adding a padding register having a length equal to the length of the instruction register of the master TAP less the length of the instruction register of the each other TAP and having an input connected to the circuit TDI, and an output; adding a TMS circuit responsive to a predetermined TAP selection code of the each other TAP for gating TMS pulses applied to the circuit TMS input to the each other TAP; adding a TDI circuit responsive to a shift state signal for connecting the TAP TDI to either the circuit TDI and or the output of the padding register.

A further aspect of the present invention is defined as a method of controlling or using a circuit having a plurality of Test Access Port interfaces in which one of the TAPs is connected to circuit test inputs and outputs and each the TAP interface includes a TAP Test Data Input a TAP Test Data Output a TAP Test Mode Select input, a TAP clock input and a TAP reset input an instruction register and at least one test data register, comprising: (a) loading each test instruction into the instruction register of the one of the TAPs, each instruction including a TAP selection code specifying the TAP to be accessed in the next instruction; (b) connecting the TDO of the TAP having a predetermined TAP selection code corresponding to the TAP selection code stored in the instruction register to the TDO of the circuit; (c) connecting the TAP TDI of all TAPs to the circuit TDI when accessing a test data register of a TAP; (d) connecting the TAP TDI of all TAPs to a serial output of respective padding register when the instruction register of a TAP is to be accessed; and (e) applying a sufficient number of clock cycles to shift data into the test data register or an instruction into the instruction register of the specified TAP; and (f) repeating steps (a)–(f) for each additional data transfer operation.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

Figure 1:
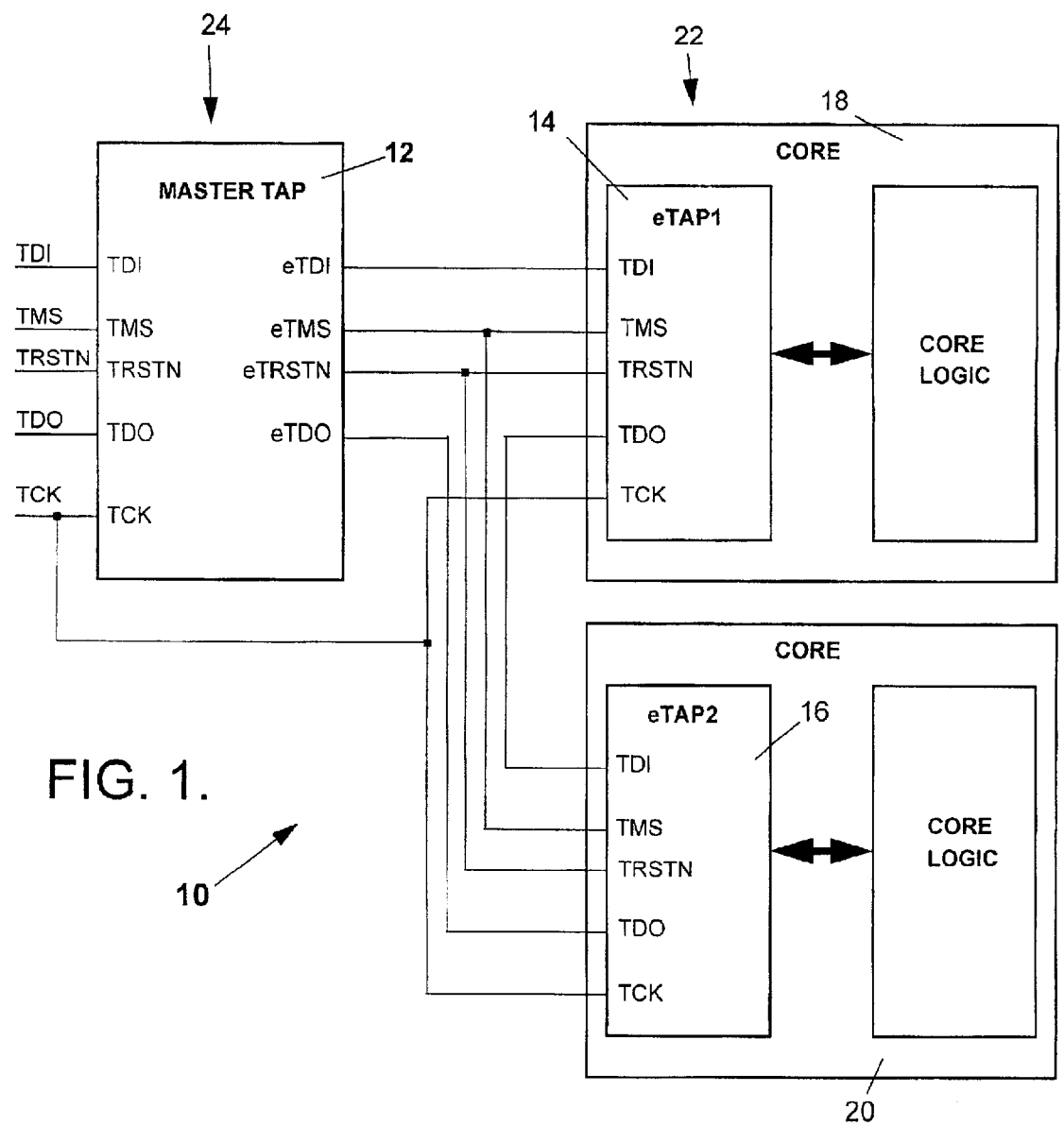
FIG. 1 is illustrates a simple circuit having three TAPs arranged according to one embodiment of the method of present invention.

FIG. 1 shows a typical arrangement of TAPs contained in a circuit 10 according to the proposed invention. A first TAP 12, called Master TAP, generates control signals for two embedded (secondary) TAPs, called eTAP1 14 and eTAP2 16. Each of the TAPs has a Test Data Input (TDI), a Test Data Output (TDO), a Test Mode Select (TMS) input, a Test Reset input (TRSTN) and a Test Clock input (TCK). All TAPs also have an instruction register and at least one test data register (TDR). All these features of the TAPs are well known in the art and documented in the IEEE 1149.1 test bus standard.

Figure 5:
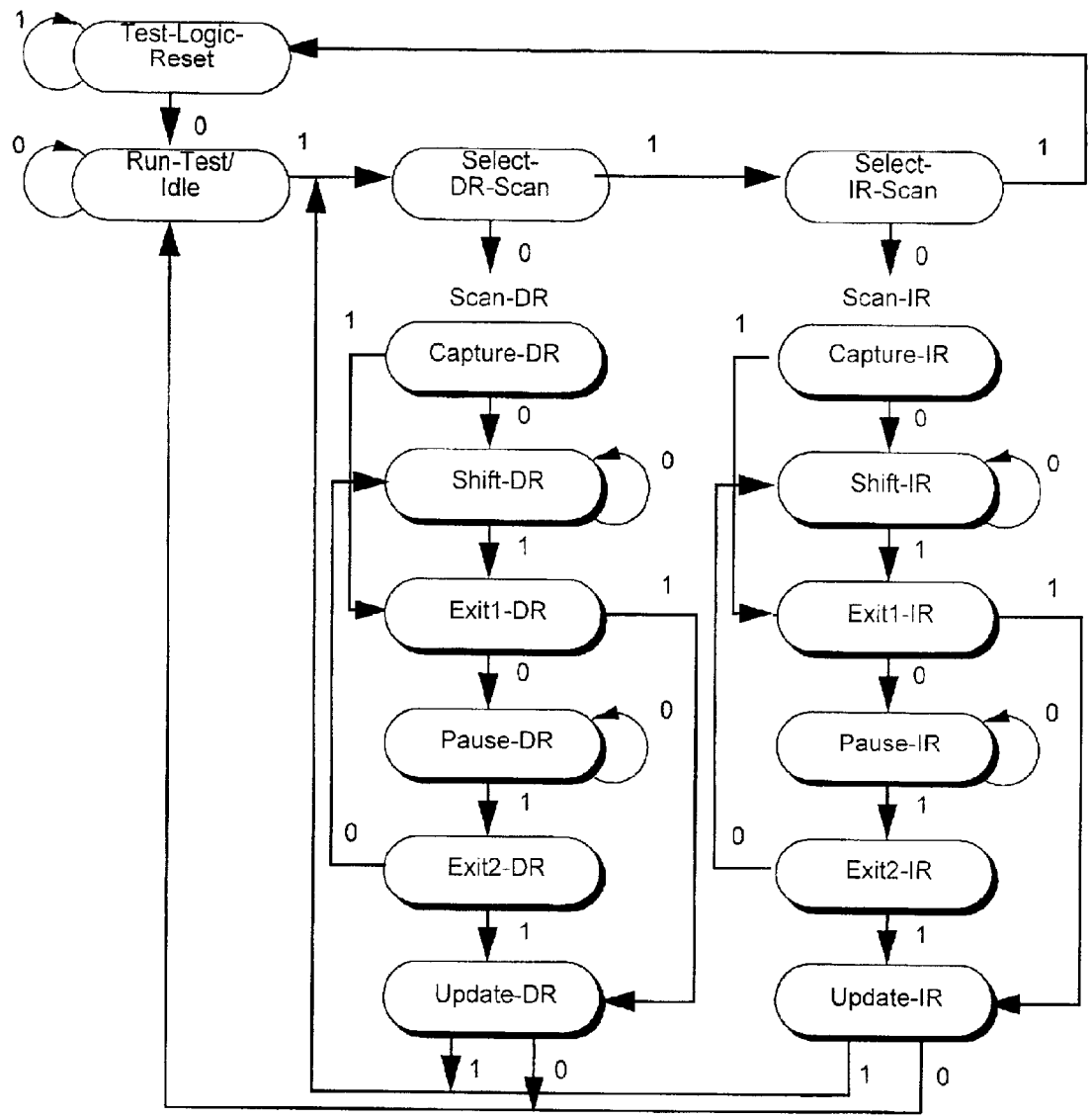
FIG. 5 illustrates the state diagram of an IEEE 1149.1 compliant TAP.

By way of background, the standard Test Access Port interface operates under control of a TAP controller state machine according to TMS and TCK. FIG. 5 is a state diagram illustrating the sixteen states of the state machine as defined by the standard and the mechanism for moving from one state to the next. State sequencing is determined by the logic values applied to the TMS pin as TCK is pulsed. When the TAP controller is in the Shift-IR state, the TAP instruction register is selected such that data can be shifted through it. Data is propagated to the TDO pin on the falling edge of TCK. Data at the TDI pin is captured on the rising edge of TCK. When the TAP controller is in the Update-IR state, the instruction that has been loaded into the instruction register is propagated to parallel outputs of the instruction register, selecting either a Bypass Register or another Test Data Register (TDR) for shift or capture operations. When the TAP controller is in the Capture-DR state, test data is captured into the selected TDR on the next rising edge of TCK. When the TAP controller is in the Shift-DR state, data is shifted through the selected TDR via TDI and TDO. As with the instruction register, data is propagated to TDO on the falling edge of TCK and capture at TDI on the rising edge of TCK.

The instruction register and each TDR consist of one or more cells. The number of cells in a register is the number of bits in its shift register. A Bypass Register is defined by the standard to have only one cell. Other registers, such as the boundary scan register (BSR), may have any number of cells.

Each cell in a register is permitted to have a parallel input for use in capturing data into the cell. Data is captured into the parallel inputs of a TDR on the rising edge of TCK when the TAP controller is in the Capture-DR state. Similarly, data may be captured into the parallel inputs of the instruction register on the rising edge of TCK when the TAP controller is in the Capture-IR state. For certain TDRs, such as the Bypass Register, BSR, and Device Instruction Register (DIR), the standard requires that each cell within the TDR have a parallel input. For the Bypass Register, the standard dictates that a logic 0 will be captured.

The instruction register is required to have latched parallel outputs. These outputs do not change except in response to the falling edge of TCK when the TAP controller is in the Update-IR state. Each cell in the BSR that is associated with output signals is also required to have a latched parallel output. In the test mode of operation, these outputs do not change except in response to the falling edge of TCK when the TAP controller is in the Update-DR state.

Returning to FIG. 1, the two embedded TAPs are shown to be part of processor cores 18 and 20, but may be part of any other core used to design complex circuits. The test data registers (not shown) of the TAPs can be used to control test and debug functions of the cores. The embedded TAPs are connected in a daisy-chain fashion, a configuration that is expected by many software development systems. The TDI of embedded TAP 16 is connected to the TDO of the preceding TAP, embedded TAP 14, in the chain. The TDI of TAP 14 is connected to an eTDI output of Master TAP 12 and the TDO output of TAP 16 is connected to an eTDO input of the Master TAP 12.

It will be understood that more than two such cores can be connected that way in the same circuit and the proposed invention has no limitation in that respect. All TAPs have a test clock input connected to the chip Test Clock Input, TCK.

The Master TAP has its TDI, TDO, TMS input and Test Reset input connected to the circuit TDI, circuit TDO, circuit TMS input and circuit test reset input, respectively, and produces a TMS, TRSTN, for each of the remaining TAPs or TAP groups. The Master TAP also controls the TDI and TDO of each of the remaining TAPs as will now be explained.

The TAPs, including the Master TAP, are arranged in two or more groups of TAPs. Each group, save that of the Master TAP, may have one or more TAPs. The Master TAP is the sole member of its group. In the illustrated example circuit, embedded TAPs 14 and 16 are arranged in a first group 22 of TAPs and the Master TAP 12 forms a second group 24. More groups can be formed without departing from the spirit of the present invention. Typically, two groups should be sufficient. However, the designer might elect to have more groups for a number of design considerations. For example, the designer might need to keep the length of the chain formed by the instruction registers under a certain value within a group. There could be a limitation of the software development system that limits the number of TAPs in a daisy-chain. The only constraint associated with the proposed method is that the default TAP must be the only TAP in its group in order for the circuit to be compliant with the 1149.1 standard. The default TAP is the TAP selected after a reset operation. Typically, it would be the Master TAP as shown in FIG. 1. A group can consist of a single TAP. In fact, in the case where the default TAP, i.e. the TAP selected after a reset, is not the Master TAP, the default TAP must to be arranged to be the only one in its group. Operations such as instruction register access or test data register access can be performed on only one group of TAPs at any given time. All TAPs within a group are connected in a daisy-chain fashion.

The TDI input of the first TAP in the chain is connected to a dedicated group TDI output of the Master TAP, similar to the eTDI output discussed earlier. The TDO output of the last TAP in the chain is connected to a dedicated TDO input to the Master TAP, similar to the eTDO input discussed earlier. The TMS input of all TAPs of a group is connected to a dedicated group TMS output of the Master TAP, similar to the eTMS output discussed earlier. Only the eTRSTN output of the Master TAP can be shared by all groups to control the test reset input of all TAPs.

Before describing details of the circuit, it will be useful to briefly describe the mode of operation of the circuit. This will facilitate understanding of the circuitry.

When a test operation is initiated, only the Master TAP (or a default TAP) is active, which allows an instruction to be loaded into the Master (default) TAP. A group selection code in the instruction selects one of the groups for data transfer. If the Master TAP is selected, data may be serially loaded into the Master TAP instruction register or one of its data registers. Similarly, if one of the other groups is selected, data is serially loaded into the serially connected instruction registers of all of the TAPS in the group. The data will contain an instruction for each of the TAPs in the group.

Each TAP operates under the control of its own Finite State Machine (FSM) which, in turn, operates under the control of the TMS and TCK signals applied to the standard test inputs of the circuit. As will be seen below, the Master TAP intercepts the standard signals and modifies them in a predetermined manner and to control all of the TAPs in the circuit. No modifications need be made to embedded TAPs.

In the design of the circuit, one of the existing TAPs may be selected and modified in the manner described below to serve as the Master TAP. Thus, it is not necessary to add an additional TAP to the circuit, although that is a possibility. However, an additional or new TAP would be required if none of the existing TAPs can be modified.

Figure 2:
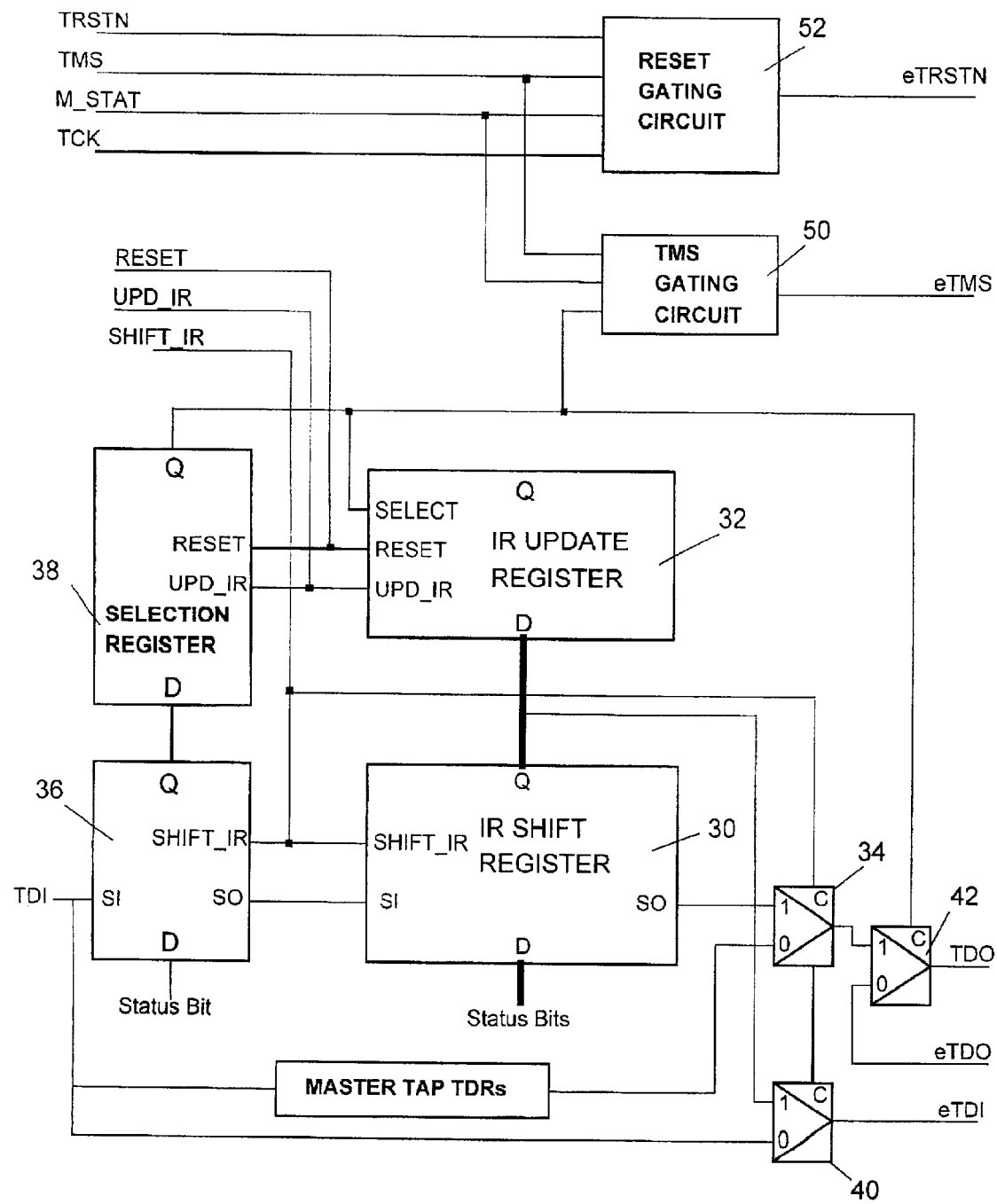
FIG. 2 is a block diagram of a Master TAP according to one embodiment of a circuit constructed according to the present invention.

FIG. 2 illustrates circuitry, according to one embodiment of the present invention, required in the Master TAP to implement the invention for the circuit of FIG. 1. Very little additional circuitry is required and most of the circuitry can be located around an existing TAP design, facilitating the implementation. Master TAP 12 includes an instruction register comprised of a shift register 30 and an update register 32 and a multiplexer 34 for selecting between the serial output, SO, of the instruction register and the serial output of a test data register currently selected by the Master TAP. These components are existing components prescribed by the IEEE 1149.1 standard. Instructions are shifted in to the instruction register via the circuit TDI input. The Master TAP Finite State Machine, not shown, generates an active signal, Shift_IR, to indicate when instructions are shifted in. Once all bits of the instruction have been loaded into register 30, they are transferred in parallel to update register 32 under control of an active UPD_IR signal also generated by the FSM. All of this circuitry and associated operation are described in detail in the IEEE 1149.1 standard.

In accordance with the present invention, the size of the instruction register connected between the circuit TDI input and circuit TDO output is arranged to be exactly the same for all TAP groups. This allows for much simpler control of the selection of the groups. This may require modification of the instruction register chain length in secondary TAP groups. As explained below, this is automatically accommodated in the Master TAP. No modifications are required in secondary TAPs.

The most significant bits of the instruction register of the Master TAP define a selection code for use in selecting the TAP group whose instruction register and test data registers will be accessed next. All modifications required to add the selection code and adjust the length of the instruction register being connected between the circuit TDI input and circuit TDO output are centralized in the Master TAP and do not require modification of any of the other TAPs.

Referring to FIG. 2, a shift register 36 and an associated update register 38 form extensions of the instruction register 30 and update register 32, respectively, of the Master TAP. The bits of this portion of the instruction register form the selection code which is available at the output Q of update register 38. The number of bits of shift register 36 must be sufficient to select any of the TAP groups. In the simple example of FIG. 1, only two groups are present and, therefore, only one selection code bit is required. An active value selects the Master TAP group. An inactive value selects group 22. The number of bits of shift register 30 is not less than the combined length of the instruction registers of any of the TAP groups. If this not the case, instruction bits are added on the TDI side of the serial input of the Master TAP until the length of the instruction of the Master TAP is the same as the maximum combined length of the instruction registers of the TAP groups. By way of example, if the length of the instruction register of embedded TAP 14 is three bits and the length of the instruction register of embedded TAP 16 is four bits, then the length of register 30 of the Master TAP must be seven bits plus one bit for the selection code for a total of eight bits. Instruction bits can be added between the circuit TDI and the instruction register or between the instruction register and the circuit TDO. It is preferred to add the instruction bits on the "TDI side" of the instruction register because TAPs allow such extension of the instruction register in many cases. However, it is conceivable to add the additional instruction bits on the "TDO side". The important point is to keep the length of the instruction the same for all groups and the selection code bits in the same position.

As mentioned, the bits of register 30 are transferred in parallel to update register 32 or decoded and the result of the decoding stored in the update register. It should be noted that the length of the update register need not match the length of register 30 because there might be decoding logic between the shift register and the update register. In fact, this is a common situation. The Q outputs of register 32 are connected to various components that have not been described because they are not directly related to the invention. Some of the bits are decoded to select the test data register that may connected between TDI and TDO. The result of this selection is connected to input 0 of multiplexer 34. Other bits are connected to embedded test controllers. Still other bits may be used to control debug features defined by the user.

The Status bit inputs to registers 30 and 36 are used to observe the state of any signal (or node) in the circuit. The signals could originate from the FSM or from logic test controllers (not shown). In a normal TAP, the two status bits closest to TDO must be tied to 0 and 1 as specified in the IEEE 1149.1 standard. In the example shown in FIG. 2, there is only one status bit input to register 36 because the selection register only needs one bit to select between the two TAP groups. The rest of the instruction register must have at least two bits.

The eTDI output of the Master TAP is the output of multiplexer 40. This multiplexer selects between the circuit TDI input and one of the Q outputs of register 30 under control of a Shift_IR signal. The output of register 30 is chosen such that a number of bits between the circuit TDI input and eTDI are added to the sum of the instruction register lengths of the embedded TAP group to make the resulting length identical to the length of the Master TAP instruction register. This will be better understood by reference to FIG. 3, described later.

The select input of multiplexer 40 is connected to control signal, Shift_IR, generated by the FSM. An active value (logic 1) of the control signal indicates that an instruction is being shifted in. In this case, a portion of the instruction register shift register is connected between the circuit TDI and the group TDI, eTDI, so as to make the instruction register chain length of the selected TAP group the same as the length of the Master TAP instruction register. An inactive (logic 0) value of the control signal indicates that an instruction is not being loaded and that a data register may being accessed and, accordingly, circuit TDI Input is connected directly to the group TDI, eTDI.

A TDO multiplexer 42 selects between the output of multiplexer 34, the TDO of the Master TAP, and input eTDO. It will be recalled that eTDO receives the TDO output of the last TAP of a TAP group. In the simple example circuit illustrated herein, an active value (logic 1) of the selection code selects the TDO output of Master TAP 12 whereas an inactive value (logic 0) selects the TDO output of TAP group 22. It will be understood that multiplexer 42 would require a selection code with more bits if there were more than two TAP groups from which to select.

A TMS gating circuit 50 is provided for each group. TMS circuit 50 generates output signal eTMS. eTMS is connected to the TMS input of each TAP in the group of embedded TAPs, as shown in FIG. 1. The inputs to gating circuit 50 are the chip TMS input, the signal, M_State, indicative of the current state of the Master TAP FSM, and the selection code. The logic of the gating circuit is very simple. If the group is selected (selection code is 0), OR the current state, M_State, is the Test-Logic-Reset state, then eTMS is identical to TMS. Otherwise, eTMS is forced to 0.

After a reset, all TAPs start from the Test-Logic-Reset state and move to the Run-Test-Idle state consequent to TMS becoming 0, as shown in FIG. 5. Once in the Run-Test-Idle state, eTMS is allowed to take a value of 1 only if TMS is 1 AND the selection code is 0. Otherwise, eTMS will be 0 and the deselected TAPs are kept in the Run-Test-Idle state whereas the selected TAP, the Master TAP in this case, will move from one state to another according to the value of TMS as specified in the standard.

Eventually, an instruction will change the selection code from 1 to 0 during the Update-IR state of the FSM. At that time, eTMS will be identical to TMS and the state machine of the embedded TAPs will be free to move from one state to the other. A dedicated first gating circuit is needed for each TAP group because the selection code associated with each group is different.

An UPDATE-IR gating circuit forms part of update register 32 and operates to prevent an update of the Master TAP instruction register when the Master TAP is not currently selected. Input SELECT, representing the selection code, is gated with input UPD_IR, generated by the FSM during the Update-IR state, such that the update is suppressed if SELECT is 0 and the update is performed if SELECT is 1.

A RESET gating circuit 52 controls the test reset (TRSTN) input of all of the embedded TAPs. In the IEEE 1149.1 standard, there are two ways of performing a reset of the test logic. These include an asynchronous reset and a synchronous reset. An asynchronous reset is performed by applying an active value (logic 0 in the standard) to the chip test reset input. The result of doing so moves the FSM to the Test-Logic-Reset state immediately without a need for applying clock pulses and irrespective of the current state of the FSM. The RESET gating circuit simply transfers an active value of TRSTN to the eTRSTN output to reset the embedded TAPs.

Figure 4:
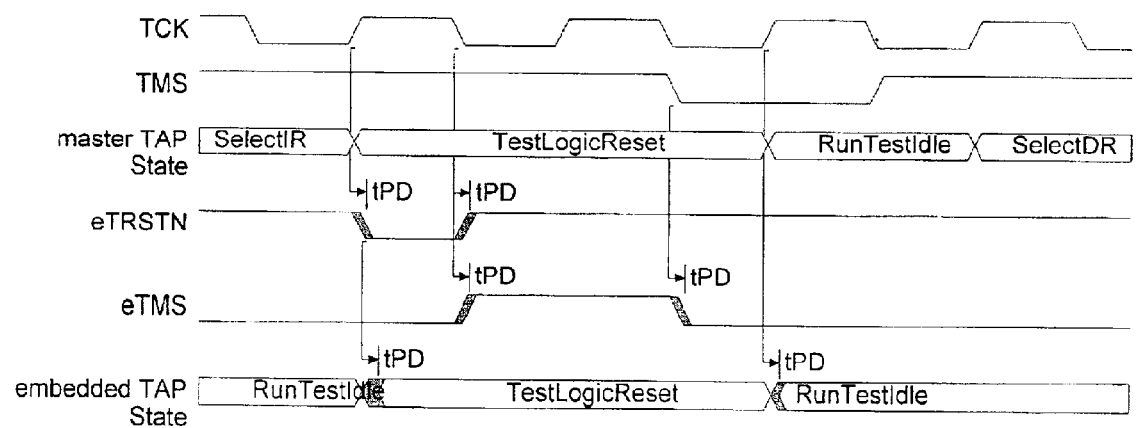
FIG. 4 is a timing diagram illustrating the synchronization of the TAPs during a reset.

A synchronous reset is performed by applying, at most, five test clock pulses during which the chip TMS input has a value of 1. The embedded TAPs will not be able to perform a synchronous reset if they are deselected because the TMS gating circuit keeps eTMS inactive (logic 0). Thus, a circuit is needed to move the state of the embedded TAPs from Run-Test-Idle to Test-Logic-Reset. The RESET gating circuit will generate an active eTRSTN output and perform an asynchronous reset when the finite state machine of the Master TAP goes through the Select-IR-Scan and the chip TMS is 1, indicating that the finite state machine will move to the Test-Logic-Reset state on the next rising edge of TCK. FIG. 4 shows the synchronization of the TAPs around the time of a synchronous reset sequence. The low-going pulse on eTRSTN must be short enough to allow the state machine of embedded TAPs to move to the Run-Test-Idle state if TMS has a value of 0 on the next rising edge of TCK. In the present embodiment, a low-going pulse of the inverted circuit test clock input, TCK, is used. However, other methods can be used. Gating logic (not shown) is provided for loading a default selection code after a reset. In the illustrated circuit, the default selection code is set to logic 1 so that the Master TAP becomes the active TAP after a reset. In order to preserve compliance with the standard, it is necessary to load the selection code that selects the default TAP which implements the mandatory instructions of the standard.

Figure 3:
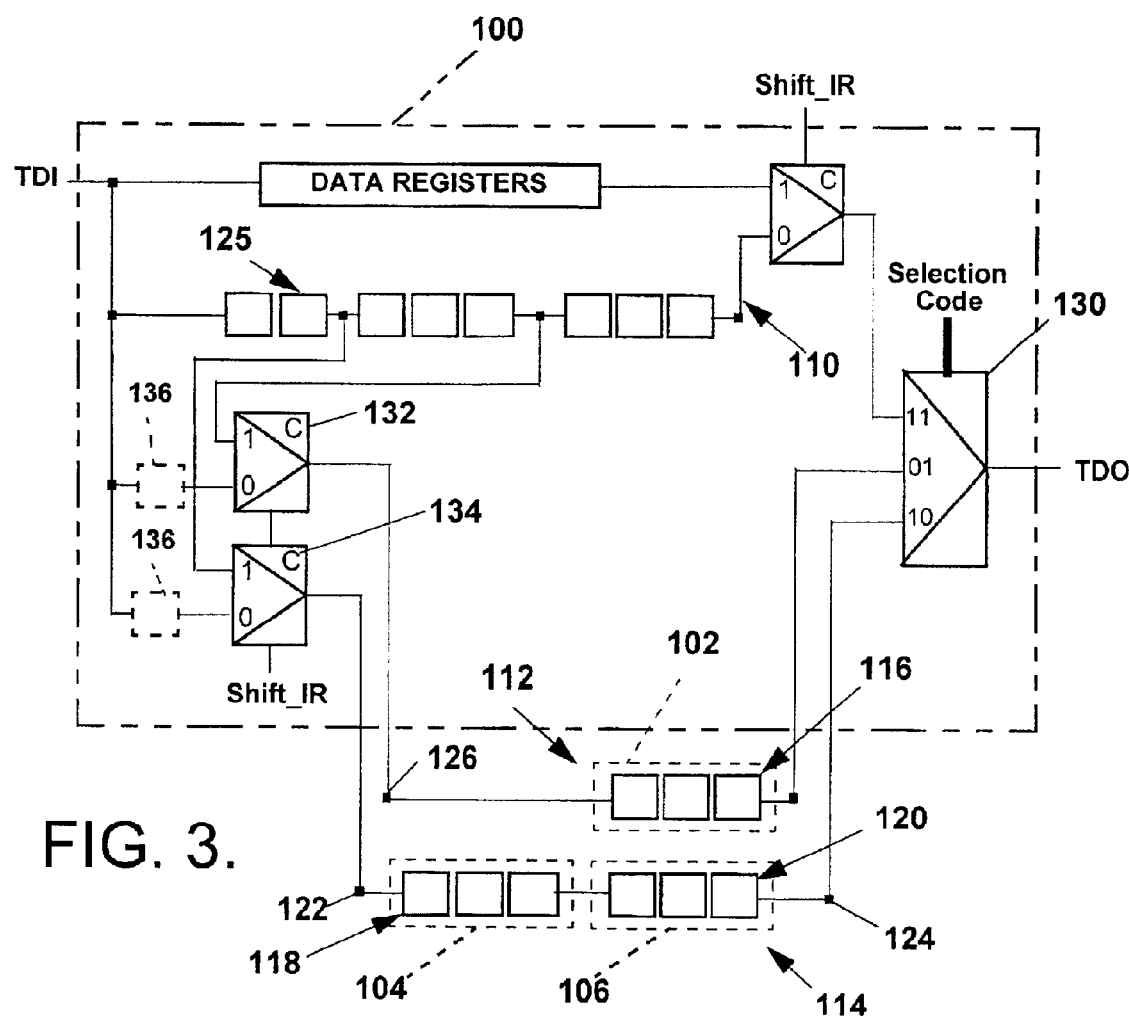
FIG. 3 is a schematic illustrating a three TAP group embodiment and showing instruction register shift register bit elements of each TAP and the manner in which the group instruction length is made equal in all groups according to an embodiment of the present invention.

FIG. 3 illustrates salient portions of a Master TAP 100 and three embedded TAPS 102, 104 and 106, shown by dotted rectangles. To simplify the figure and the description, a number of components, such as the update registers, data registers and gating circuits, have not be included in the figure. In this figure, the four TAPs have been arranged into three TAP groups 110, 112 and 114. Master TAP 100 is the sole member of its TAP group, group 110, as required according to the present invention. The three embedded TAPS are arranged into two TAP groups 112 and 114. TAP 102 is the sole member of TAP group 112 and has an instruction register 116 comprised of three shift register elements. TAPs 104 and 106 are located in group 114 and have instruction registers 118 and 120, respectively, each also having three shift register elements. Instruction registers 104 and 106 are serially connected in a serial or daisy chain between a group TDI node 122 and a group TDO node 124. Group 114 has the longest instruction register chain length of the embedded groups, having a total of six shift register elements or bits.

In accordance with the present invention, the length of the instruction register 125 of the Master TAP is equal to the length of the longest embedded TAP group instruction register chain, six bits in this case, plus a number of bits for storing the selection code. Since the TAPs have been arranged into three groups in this example, two selection code bits are required to uniquely identify each of the three groups. Thus, the total length of the Master TAP instruction register is eight.

The embedded TAPs could also have been arranged into two groups, with the Master TAP being in one group and embedded TAPs 102, 104 and 106 being in a second group. In that case, the total length of the embedded or secondary TAP instruction register chain would be nine bits. One selection code bit would be required to uniquely identify the two groups and the length of the Master TAP instruction register would be ten shift register elements or bits.

To facilitate loading of instructions into the various groups, the groups are designed so that the number of clock cycles required to scan or shift into any group is the same for all groups. This can be achieved in a number of ways. One way, shown in FIG. 3, is to incorporate a required number of shift register elements of the Master TAP instruction register into the instruction scan path of a group. For example, the total number of shift register elements of the Master TAP group is eight, whereas that of group 112 is three and that of group 114 is six. The instruction scan path of group 112 can be increased to the required eight bits by connecting the output of the fifth shift register element of the Master TAP instruction register to the TDI input 126 of group 112 (via multiplexer 132 described below) so that the scan path for group 112 includes five elements from Master TAP group 110 and the three elements of TAP 102. The five elements may be referred to as a "padding register". Similarly, the length of the instruction scan path of group 114 can be increased to eight bits by connecting the output of the second shift register element of the Master TAP instruction register to the TDI input 122 of group 114 (via multiplexer 134 described below) so that the scan path for group 114 includes two padding shift elements from group 110 and the six elements of TAPs 104 and 106.

Another way of achieving the same result is to add the appropriate number of shift register elements to the instruction scan path of a group between the circuit TDI and the group TDI.

FIG. 3 also shows a three input TDO multiplexer 130 which receives the TDO output of each of the three TAP groups and whose output is connected to the circuit TDO. This multiplexer corresponds to multiplexer 42 in FIG. 2. The select input of multiplexer 130 is the selection code which originates from the two most significant bits of the Master TAP instruction register. As previously explained, the selection code becomes available when it is parallel loaded into an update register (not shown in FIG. 3) corresponding to register 38.

Still further, FIG. 3 shows TDI multiplexers 132 and 134 associated with embedded TAP groups 112 and 114, respectively, and correspond to previously mentioned multiplexer 40. TDI Multiplexers 132 and 134 are controlled by the Shift-IR control signal to determine the source of the data loaded into a TAP group. When an instruction is loaded into an instruction register, Shift-IR is active (Logic 1), which connect input 1 of each of multiplexers 132 and 134 to their respective group TDI input. Conversely, when data is being loaded into a test data register, Shift-IR is inactive (logic 0), which connects input 0 of each of multiplexers 132 and 134 to the group TDI input. Input 0 of multiplexers 132 and 134 is connected to the circuit TDI pin, as shown. Only the group specified by the previously loaded selection code will transfer data between the circuit TDI and TDO pins. Except for the Master TAP group, the other groups are precluded from shifting data because their respective TMS gating circuit produces an inactive (logic 0) TMS signal when the active TAP selection code does not correspond to the predetermined group selection code.

Method of Use

The method of use of the circuit will now be described with reference to FIG. 2. A reset will usually be applied first to start the TAPs from a known state. As indicated in the previous paragraph, the Master TAP is the first TAP selected. An instruction is first loaded into the instruction register of the Master TAP. The instruction will contain a selection code which specifies the TAP group which is to be selected next. If it is desired to access a TAP in embedded TAP group 22 of the illustrated circuit, a value of 0 will be loaded into selection code register 36. This value will be loaded into update register 38 when the Master TAP FSM is sequenced to the Update-IR state. The selection code will then become available at the Q output of register 38 and cause multiplexer 42 to connect input eTDO from the TDO output of group 22 to the circuit TDO.

To load an instruction into TAPs 14 and 16, TMS values are applied to the circuit TMS pin to simultaneously sequence to two embedded TAPs to their Shift-IR state. These values are processed in TMS gating circuit 50 and applied to the TMS input of each of TAPs 14 and 16 of selected TAP group 22 via the eTMS output of circuit 50. In the Shift-IR state, control signal Shift-IR is active and causes multiplexer 40 to connect the appropriate Q output of Master TAP instruction register 30 to the eTDI output of the Master TAP. This establishes a serial path from the circuit TDI, through register 36, a portion of register 30, from the Q output of register 30 to input 1 of multiplexer 40 to the eTDI output. The test clock, TCK, is then toggled a predetermined number of times to load an instruction from the circuit TD! into each TAP of the selected group. The last bit which is loaded is the selection code which specified the group to which the next operation will apply. The target TAP in embedded TAP group 22 will contain a desired instruction. The other TAPs of the group may be loaded with an instruction code corresponding to the BYPASS instruction. TAPs which reside in a non-selected group are kept in the Run_Test_Idle (RTI) state. The Master TAP is never put into the RTI state.

The test data registers of the embedded TAPs are accessed in the conventional fashion, i.e. by loading an appropriate instruction into the embedded TAP of interest, using the procedure described in the previous paragraph. The TAP of interest will respond to that instruction by connecting the data register of interest between its TDI input and TDO output. To shift into or out of the test data register, the embedded TAP is sequenced to the Shift-DR state. In that state, Shift-IR is inactive and, therefore, multiplexer 40 in Master TAP selects the circuit TDI input for output to eTDI.

The Master TAP is accessed simply by loading a logic 1 into shift register 38. This connects the output of multiplexer 34, which is the TDO output of the Master TAP, to input 1 of multiplexer 42. The output of multiplexer 42 is connected to the circuit TDO. An instruction is loaded into register 30 by sequencing the Master TAP to the Shift-IR state, in which signal Shift-IR is active, causing multiplexer 34 to select the SO output of register 30. The test data registers of the Master TAP are accessed by sequencing the Master TAP to the Shift-DR state, in which state the Shift-IR signal is inactive which causes multiplexer 34 to select input 0 which is connected to Master TAP test data registers. The particular test data register which is connected to multiplexer 34 depends on the instruction loaded into instruction register 30 and parallel loaded in register 32.

It will be seen from the foregoing that each of the Master TAP and the embedded TAPs can be accessed in a manner which is fully compliant with the standard. No additional signals are required to effect this operation. This is achieved by providing two simple logic circuits for each group of embedded TAPs including a TDI multiplexer for routing data between the circuit TDI and TAP group TDI and a TMS gating circuit, a multiplexer for selecting the TDO of one of the groups, and a shift register and corresponding update register for holding a TAP group selection code and a simple reset logic circuit.

Different View of Circuit

As mentioned previously, the addition of bits to the Master TAP instruction register, allows the TAPS to be viewed in different ways. From the outside of the circuit, it may appear as if the circuit contains another TAP, referred to herein as a "dummy TAP", at the beginning of each daisy-chain of a TAP group. The length of the instruction register of this dummy TAP may vary for each group because the combined length of the instruction registers of the various groups might be different.

It is possible to provide a "board" view mode of the chip in which the daisy chain of the embedded or secondary TAPs can be made to appear to software development programs like multiple chips connected in series on a board. This "board" view requires that the circuitry added in front of the embedded TAPs (i.e. the padding registers which are shared within the Master TAP) appear as a "dummy TAP" that can be fully described by a BSDL (Boundary Scan Description Language) file. To do so, three requirements must be satisfied: 1) a bypass register for the dummy TAP must be provided; 2) the dummy TAP must have at least two instruction bits; and 3) the first two status bits must capture 01. Thus, if the designer chooses to build the "board" view in his chip, a data register, such as shown by reference numeral 136 in FIG. 3, is added between the circuit TDI and the group TDI node during the shift-DR state to emulate a dummy TAP bypass register. The description of the board view will include a BSDL file describing the dummy TAP along with the existing BSDL files of the embedded TAPs. As indicated, for the dummy TAP to have a compliant BSDL file, at least two bits of the Master TAP instruction register must be part of the daisy chain of secondary TAPs so that the of the dummy TAP "instruction register" can capture a 01 value as required by the standard.

Another way of viewing the circuit in the case in which all groups contain exactly one TAP is to view the additional bits, including the selection code, as an extension of the existing instruction bits. The selection code ensures that the codes (also called opcodes) associated with the various instructions of the TAPs do not interfere with each other even, if two instructions of two different TAPs had originally the same opcode. This is especially important in the case in which TAPs or different groups share common test data registers, a situation discussed with reference to FIG. 6. For a circuit having one or more one or more groups with more than one TAP, the additional bits are simply added to the bits of the instruction register of the first TAP in the group. In each of these cases, the views are reflected in the circuit description file and BSDL files.

Shared Data Registers

Figure 6:
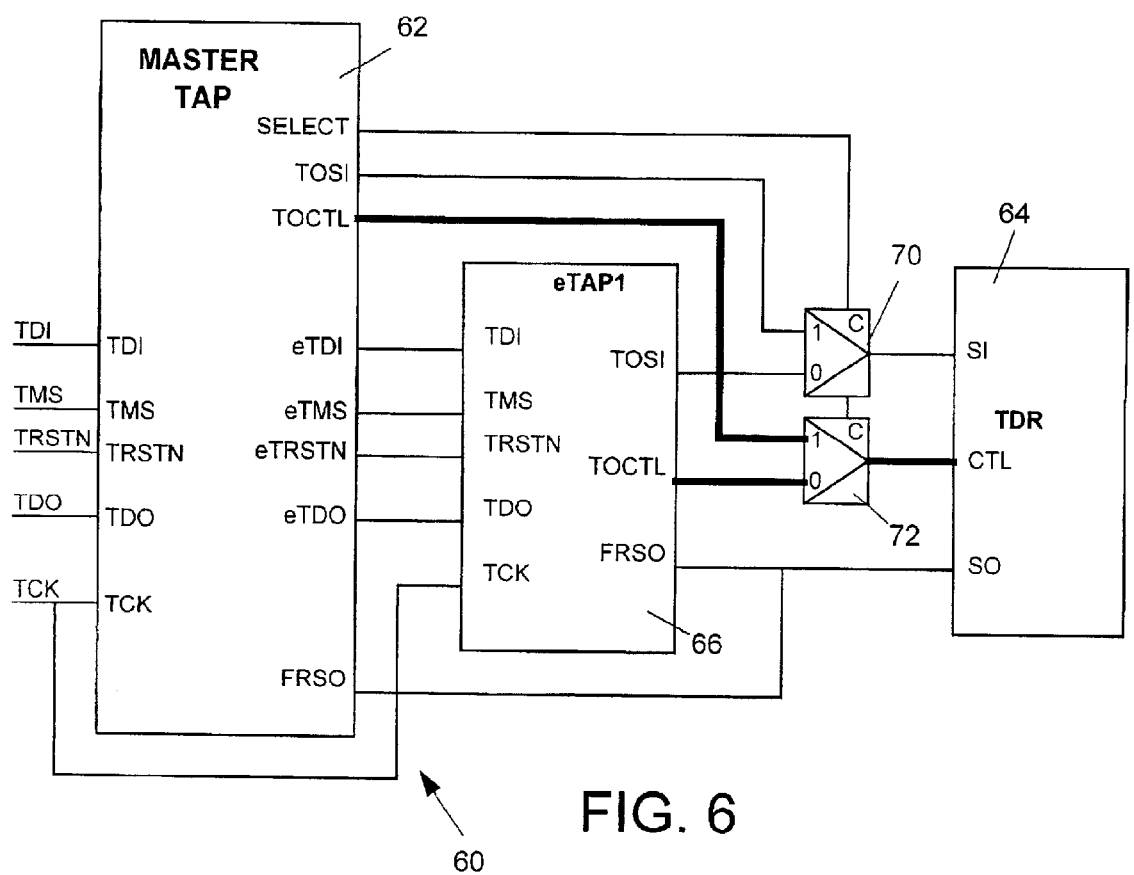
FIG. 6 is a block diagrammatic illustration of a circuit in which two TAPs share the same data register according to one embodiment of a circuit constructed according to the present invention.

FIG. 6 illustrates a simple circuit 60 in which a Master TAP 62 shares a test data register 64 with an embedded TAP 66. Test data register 64 could be a boundary scan register, for example. The test data register has a serial input, SI, a serial output SO and a control signal bus, CTL, which consists of at least one input control signal. Serial input SI is connected to the output of multiplexer 70 which selects the appropriate source for serial input SI based on the selection code generated by the Master TAP and applied to the SELECT input of TAP 66. The two potential sources are output TOSI of embedded TAP 66 and output TOSI of Master TAP 62. Similarly, a multiplexer 72 selects between output bus TOCTL of embedded TAP 66 and output bus TOCTL of Master TAP 62. A selection code value of 0 selects the outputs of embedded TAP 66 whereas a selection code value of 1 selects the outputs of the Master TAP. The test data register can equally well be shared by two groups of embedded TAPs. The serial output of test data register 64 is connected to the appropriate input of all TAPs sharing this register. In this case, serial output SO is connected to input FRSO of each of embedded TAP 64 and Master TAP 62. It is not necessary for the Master TAP to be one of the possible sources for the inputs of test data register 64. However, the Master TAP will control multiplexers 70 and 72 when two other TAPs share a data register.

Method and Program Product for Designing Circuit

As is known in the art, integrated circuit devices are typically designed and fabricated using one or more computer data files, referred to herein as hardware definition programs, that define the layout of the circuit arrangements of the devices. The programs are typically generated by design tools and are subsequently used during manufacturing to create layout masks that define the circuit arrangements applied to a semiconductor wafer. Typically, the programs are provided in a predefined format using a hardware description language (HDL) such as VHDL, verilog, EDIF, etc. While the invention has been described in the context of fully functioning integrated circuit devices and data processing systems utilizing such devices, those skilled in the art will appreciate that the various embodiments of the invention are capable of being distributed as a program product in a variety of forms, and that the invention applies equally thereto regardless of the particular type of signal bearing media used to actually carry out the distribution. Examples of signal bearing media include but are not limited to recordable type media such as volatile and nonvolatile memory devices, floppy disks, hard disk drives, CD-ROM's, and DVD's, among others and transmission type media such as digital and analog communications links.

Another important aspect of the present invention relates to a program product in the form of a circuit design tool recorded on a storage medium and a corresponding method for designing a circuit having multiple access ports and, more specifically, for modifying an existing description of a circuit having multiple TAPs so as to configure the circuit in the manner described herein.

The circuit design tool of the present invention reads a circuit description of a circuit to be processed. The circuit description may include a description of TAPs which are independent of one another or which have already been arranged into one or more daisy chain of TAPs. In either case, the TCK, TRSTN and TMS pins of all embedded TAPs will already be connected to the output of the TCK, TRSTN and TMS input buffers of the circuit. In the daisy chained arrangement, the scan path of the embedded TAPs will already be connected between the circuit TDI and circuit TDO pins in which the TDI pin of the first embedded TAP connects to the output of the TDI input buffer and the TDO pin of the last embedded TAP connects to the input of the TDO output buffer. In addition, the enable port of the TDO output buffer may or may not be driven by a TDOEnable output of one of the embedded TAPs. If it is not driven by an embedded TAP, then the output buffer will be tied on by the design tool of the present invention.

In one embodiment of the invention, using the design tool of the present invention, a designer or user will indicate to the tool the presence of secondary TAPs (embedded TAPs) within a sub-wrapper of a "TAP" wrapper called "SecondaryTAPs". "Wrapper" is syntax that describes software format which may be in the form: "WrapperName {property1:value; property2:value; propertyN:value}". "WrapperName" is the name of a wrapper and propertyX represents an attribute associated with the wrapper.

Using the tool, the user to describes each embedded TAP in the sequence in which it is connected between TDI and TDO by describing the bypass opcode it uses. Many software development systems will load the bypass instruction into all TAPs of a selected group except for the TAP of interest.

In the preferred form of the design tool of the present invention, the tool reads the circuit description file, searches for the all existing TAP descriptions and modifies the descriptions so as to provide the connections described earlier.

In both embodiments, the tool inserts a Master TAP description with the four extra ports eTDI, eTDO, eTMS, and eTRSTN. The user also specifies the identity of the default TAP, by setting a variable, such as SelectMasterTAP. The tool moves the net driven from the TDI, TMS and TRSTN input buffers to the Master TAP output ports eTDI, eTMS and eTRSTN, respectively, and the net driving the input of the TDO output buffer to the Master TAP input port eTDO. The clock connection to the test clock input, TCK, need not be changed. The tool configures the enable of the TDO buffer to be driven by a Master TAP TDOEnable port (not shown). The definition of the Master TAP created by the tool will include a description of the Reset gating logic circuit, the TMS gating logic circuit, the update suppression logic circuit, the TDI multiplexer (or multiplexers if there is more than one secondary TAP group) the definition of the padding register(s) and the TDO multiplexer.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

Reference numerals

| | |
|---|---|
| first TAP 12, called Master TAP | [5] |
| eTAP1 14 | [5] |
| eTAP2 16 | [5] |
| processor cores 18 and 20 | [7] |
| first group 22 of TAPs | [7] |
| second group 24 | [7] |
| shift register 30 | [8] |

-continued

| | |
|---|---|
| update register 32 | [9] |
| multiplexer 34 | [9] |
| shift register 36 | [9] |
| an associated update register 38 | [9] |
| multiplexer 40 | [10] |
| TDO multiplexer 42 | [11] |
| TMS gating circuit 50 | [11] |
| RESET gating circuit 52 | [12] |
| Master TAP 100 | [12] |
| embedded TAPS 102, 104 and 106 | [12] |
| three TAP groups 110, 112 and 114 | [12] |
| instruction register 116 | [13] |
| instruction registers 118 and 120 | [13] |
| group TDI node 122 | [13] |
| group TDO node 124 | [13] |
| instruction register 125 of the Master TAP | [13] |
| TDI input 126 | [13] |
| TDI multiplexers 132 and 134 associated with embedded TAP groups 112 and 114, respectively | [14] |
| a data register, such as shown by reference numeral 136 in FIG. 3 | [16] |
| circuit 60 | [17] |
| Master TAP 62 | [17] |
| test data register 64 | [17] |
| embedded TAP 66 | [17] |
| multiplexer 70 | [17] |
| a multiplexer 72 | [17] |

We claim:

1. In a method of designing a circuit containing a plurality of Test Access Port (TAP) interfaces, each said TAP having a Test Data Input (TDI), a Test Data Output (TDO), a Test Mode Select (TMS) input, a Test Clock Input and a Test Reset input (TRSTN), an instruction register and at least one test data register, the method comprising the steps of:
providing a master TAP for at least controlling data transfer operations with other TAPs in said circuit;
connecting master TAP test inputs and output to corresponding circuit test inputs and outputs;
adding to said master TAP:
an instruction register having a length equal to the length of the longest instruction register of each other TAP plus a predetermined number of bits for storing a TAP selection code for selecting one of the TAPs;
a TDO circuit responsive to the TAP selection code for selectively connecting the TDO of one of the TAPs to the circuit TDO; and
for each other TAP:
adding a padding register having a length equal to the length of said master TAP instruction register less the length of the instruction register of said each other TAP and having an input connected to the circuit TDI, and an output;
adding a TMS circuit responsive to a predetermined TAP selection code of said each other TAP for gating TMS pulses applied to the circuit TMS input to said each other TAP;
adding a TDI circuit responsive to a shift state signal for connecting the TAP TDI to either the circuit TDI and or the output of said padding register.

2. A method as defined in claim 1, further including providing, for said master TAP, an update gating circuit responsive to a predetermined TAP selection code in said selection code register and corresponding to said master TAP for allowing the update of a master TAP update register, and, otherwise, for suppressing the update register except for selection code register bits.

3. A method as defined in claim 1, further including providing said master TAP with a reset gating circuit for controlling the test reset input of remaining TAPs in said circuit for performing asynchronous and synchronous resets of TAPs, said reset gating circuit effecting an asynchronous reset of said TAPS by transferring an active value of a circuit reset signal applied to said circuit reset input to the reset input of each remaining embedded TAP in said circuit; and effecting a synchronous reset by responding to said master TAP entering a Select-IR-Scan state and application of an active TMS signal to said circuit, by applying an active reset signal to the reset input of each remaining TAP in said circuit.

4. A method as defined in claim 1, further including, for each test data register shared between two or more TAPs, said test data register having shift register elements responsive to one or more control signals, serial input and a serial output,
adding a first selector having an input for receiving serial input data for each of said two or more TAPS sharing said test data register;
adding a second selector having an input for receiving register control signal bus for each of said two or more TAPS;
each said selector being responsive to said selection code indicative of the source of the serial data and control signal bus to be applied to said shared test dat register, and
connecting said serial output of said shared register to all of said two or more TAPs.

5. A method as defined in claim 1, further including arranging said TAPS into two or more groups of one or more TAPs, including:
arranging said master TAP in a group in which it is the sole member;
connecting the TDI of said master TAP to the circuit TDI pin;
connecting the output of the TDO circuit to the circuit TDO pin;
providing, in the master TAP, a TDI output for each of the other TAP groups;
connecting the TDO output of each TAP to an input to the TDO circuit; and
providing a padding register for each TAP group whose instruction register chain length is less than the length of the instruction register of the master TAP where the length of the padding register is equal to the length of the master TAP instruction register less the sum of the length of the instruction registers in the group; and
locating each said padding register in an instruction scan path between the circuit TDI and the TAP group TDI.

6. A method as defined in claim 5, said providing a master TAP including inserting a description of said master TAP into an HDL description file of said circuit.

7. A method as defined in claim 5, said providing a master TAP including modifying a description of one of said TAPs in an HDL description file of said circuit.

8. A method as defined in claim 5, said providing a master TAP including selecting an existing TAP in said circuit and modifying said TAP for use as said master TAP.

9. A method of designing a circuit containing a plurality of Test Access Ports (TAPs), each said TAP having a Test Data Input (TDO), a Test Data Output (TDO), a Test Mode Select (TMS) input, a clock input and a Test Reset (TRSTN) input, each said TAP having an instruction register and at least one test data register, the method comprising the steps of:

selecting one TAP as a master TAP;

arranging the remaining secondary TAPs into at least one group having a group TDI and a group TDO, with the TAPs in each group being serially connected in a daisy chain between said group TDI and group TDO;

determining the instruction register length of each said group;

providing said master TAP instruction register with a number of register elements equal to that of the longest group instruction register length plus a number of bits, defining a selection code register, for storing a selection code for use in selecting one of said groups for data transfer;

providing, for each said group, a group padding register having an input connected to the circuit TDI, an output and having a length equal to the length of said master TAP instruction register less the instruction register length of said group;

providing, for each said group, a TMS gating circuit responsive to a circuit TMS input and to a predetermined selection code representative of said group for producing and applying a group TMS signal to each TAP of said group, said group TMS signal being the same as the circuit TMS input when an applied selection code corresponds to the predetermined group selection code corresponding to said group and, otherwise, said TMS signal being inactive, said TMS gating circuit having a TMS input connected to said circuit TMS input; a selection code input connected to said master TAP selection code register and an output connected to the TMS input of all TAPs of the group;

providing, for each said group, a TDI multiplexer circuit for selectively connecting the group TDI to either the circuit TDI when a test data register in the group are being accessed, or to the output of said group padding register when the instruction registers of the group are being accessed and connecting the output of said TDI multiplexer circuit to the group TDI of the first TAP in the daisy-chain;

providing a TDO multiplexer circuit for selectively connecting the group TDO of the group specified by a selection code loaded in said selection code register;

providing, for said master TAP, an update gating circuit responsive to a predetermined group selection code in said selection code register and corresponding to said master TAP for allowing the update of a master TAP update register, and, otherwise, for suppressing the update register except for selection code register bits; and adding a reset gating circuit to said master TAP for controlling the test reset input of remaining TAPs such that said remaining TAPs are reset when the master TAP is reset.

10. A method as defined in claim 9, further including adding gating logic for loading a default selection code into said selection code register after a reset.

11. A method as defined in claim 10, wherein the default selection code is the selection code corresponding to that of the master TAP or any of the groups.

12. A method as defined in claim 9, said providing a group padding register, including forming said padding register as a portion of the master TAP instruction register.

13. A method as defined in claim 9, said providing a group padding register including providing a serially connected memory elements between the circuit TDI and the group TDI.

14. A method as defined in claim 9, wherein the number of groups is two and the number of TAPs in each group is one.

15. A method as defined in claim 9, further including providing a predetermined number of groups, with each group having one TAP.

16. A method as defined in claim 9, wherein said TAPs are designed according to the IEEE 1149.1 standard.

17. A method as defined in claim 9, wherein the resulting circuit is compliant to the IEEE 1149.1 standard.

18. A method as defined in claim 9, wherein said TDI multiplexer circuit being operable to select between a bypass register and said padding register, said bypass register having of a single memory element connected between the circuit TDI and the TDI multiplexer.

19. A method as defined in claim 9, wherein the length of said padding register is at least two and its first two shift register elements closest to the circuit TDO capture 0 and 1, respectively, during the execution of a Capture-IR instruction.

20. A method as defined in claim 9, said TDI multiplexer circuit being operable to select between a bypass register and the output of said padding register, said bypass register having of a single memory element connected between the circuit TDI and the TDI multiplexer; and the length of said padding register is at least two shift register elements with the first and second shift register elements closest to the circuit TDO capture 0 and 1, respectively, during execution of a Capture-IR instruction.

21. A method as defined in claim 9, further including, for each test data register shared between two or more TAPs, said test data register having shift register elements responsive to one or more control signals, serial input and a serial output, adding a first selector having an input for receiving serial input data for each of said two or more TAPS sharing said test data register;

adding a second selector having an input for receiving register control signal bus for each of said two or more TAPS;

each said selector being responsive to said selection code indicative of the source of the serial data and control signal bus to be applied to said shared test dat register, and connecting said serial output of said shared register to all of said two or more TAPs.

22. In a method of designing a circuit containing a plurality of Test Access Port (TAP) interfaces, each said TAP having a Test Data Input (TDI), a Test Data Output (TDO), a Test Mode Select (TMS) input, a Test Clock Input and a Test Reset input (TRSTN), an instruction register and at least one test data register, the method comprising the steps of:

providing a master TAP for at least controlling data transfer operations with other TAPs in said circuit;

connecting the master TAP test inputs and output to corresponding circuit test inputs and output;

arranging said TAPs into at least two groups of one or more TAPs serially connected between a group TDI and a group TDO, said master TAP being the sole member of one of said groups;

providing said master TAP with:

an instruction register having a length equal to the sum of the length of the instruction registers of the longest group instruction register plus a predetermined number of bits forming a TAP selection code register for storing a group selection code for selecting one of the groups for data transfer;

a TDO circuit responsive to the group selection code for selectively connecting the group TDO of one of the groups to the circuit TDO; and for each said group:

a padding register having an output connected to the group TDI input of said each group and an input connected to the circuit TDI;

a TMS circuit responsive to predetermined group selection code for said each group for producing a group TMS; and a TDI circuit responsive to a shift state signal for either connecting a circuit TDI to the group TDI or for connecting the output of said padding register to the group TDI.

23. A method as defined in claim 22, further including providing, for said master TAP, an update gating circuit responsive to a predetermined TAP selection code in said selection code register and corresponding to the group containing said master TAP for allowing the update of a master TAP update register, and, otherwise, for suppressing the update register except for selection code register bits.

24. A method as defined in claim 22, further including providing said master TAP with a reset gating circuit for controlling the test reset input of remaining TAPs in said circuit for performing asynchronous and synchronous resets of TAPs, said reset gating circuit effecting an asynchronous reset of said TAPS by transferring an active value of a circuit reset signal applied to said circuit reset input to the reset input of each remaining embedded TAP in said circuit; and effecting a synchronous reset by responding to said master TAP entering a Select-IR-Scan state and application of an active TMS signal to said circuit, by applying an active reset signal to the reset input of each remaining TAP in said circuit.

25. A method as defined in claim 22, further including, for each test data register shared between two or more TAPs, said test data register having shift register elements responsive to one or more control signals, serial input and a serial output, adding a first selector having an input for receiving serial input data for each of said two or more TAPS sharing said test data register;

adding a second selector having an input for receiving register control signal bus for each of said two or more TAPS;

each said selector being responsive to said selection code indicative of the source of the serial data and control signal bus to be applied to said shared test dat register, and connecting said serial output of said shared register to all of said two or more TAPs.

26. A method as defined in claim 22, said providing a master TAP including inserting a description of said master TAP into an HDL description file of said circuit.

27. A method as defined in claim 22, said providing a master TAP including modifying a description of one of said TAPs into an HDL description file of said circuit.

28. A method as defined in claim 22, said providing a master TAP including selecting an existing TAP in said circuit and modifying said TAP for use as said master TAP.

29. In a circuit having a plurality of Test Access Port (TAP) interfaces, each interface having test connections including a Test Data Input (TDI), a Test Data Output (TDO), a Test Mode Select (TMS) input, a Test Clock Input and a Test Reset input (TRSTN), an instruction register and at least one test data register, comprising:

one of said TAPs having test connections serving as a circuit test interface, said one TAP having:

an instruction register having a length equal to the length of the longest instruction register plus a predetermined number of bits for storing a TAP selection code for selecting one of the TAPs;

a TDO circuit responsive to said TAP selection code for selectively connecting the TDO of one of the TAPs to the circuit TDO; and said one TAP further including, for each other TAP in said circuit:

a padding register having a length equal to the length of said instruction register of said one TAP less the length of the instruction register of said each other TAP and having an input connected to the circuit TDI, and an output;

a TMS circuit responsive to a predetermined TAP selection code associated with said each other TAP and a TMS signal applied to a circuit TMS input for producing a TAP TMS signal for said each other TAP; and a TDI circuit responsive to a shift state signal for selectively connecting the TDI of said other TAP to the circuit TDI or to the output of said padding register.

30. A circuit as defined in claim 29, further including a circuit responsive to an active test reset signal applied to said Test Reset input of said one TAP for resetting all of said TAPs and for performing an asynchronous reset of each said TAP when the finite state machine of said one TAP enters a Select-IR-Scan state and an active TMS signal Is applied to the circuit TMS input.

31. A circuit as defined in claim 29, further said master TAP further including an update gating circuit responsive to a predetermined group selection code in said selection code register and corresponding to said master TAP for allowing the update of a master TAP update register, and, otherwise, suppressing the update of said update register except for selection code register bits.

32. A circuit as defined in claim 29, each said TDI circuit for being responsive to an inactive shift state signal of said master TAP for connecting a circuit TDI to the TDI of said each other TAP for accessing a test data register of said each other TAP and responsive to an active shift state signal for connecting said padding register to the TDI of said each TAP for accessing the instruction register of said each TAP.

33. A circuit as defined in claim 32, said padding register being equal in length to the difference between the length of the instruction register of said one TAP and the length of the instruction register of said each other TAP.

34. A circuit as defined in claim 29, said TAPs being arranged in at least two groups of serially connected TAPs in which the TDI of each TAP is connected to the TDO of a preceding TAP;

the TDI of the first TAP in a group defining a group TDI and being connected to a respective TAP TDI output of said one TAP; and the TDO of the last TAP in a group defining a group TDO and being connected to a respective TDO input of said one TAP;

said one TAP being the sole member of one of said groups; said TMS circuit being operable to produce a TAP TMS signal for each TAP of a group.

35. In a circuit having a plurality of Test Access Port (TAP) interfaces, each said TAP having a TAP Test Data Input (TDI), a TAP Test Data Output (TDO), a TAP Test Mode Select (TMS) input, a TAP clock input and a TAP Test Reset (TRSTN) input, a TAP instruction register and at least one TAP test data register, said circuit having a circuit Test Data Input, a circuit Test Data Input, a circuit Test Data Output, a circuit Test Mode Select input, a circuit Test Clock input and a circuit reset input, the improvement comprising:

one of said TAPs being a master TAP;

said TAPs being arranged into at least two groups of one or more TAPs having a group TDI and a group TDO, the TAPs in each said group being daisy-chained between said group TDI and group TDO such that the TDI of each TAP is connected to the TDO of the preceding TAP in the chain, said master TAP being the sole member of one of said groups;

said master TAP having an instruction register bit length equal to the bit length of the longest group instruction register chain length of said groups plus a predetermined number of bits, defining a selection code register, for storing a group selection code for selecting any one of said groups;

a TDO multiplexer circuit responsive to said selection code for selecting the group TDO of the group corresponding to a selection code loaded into said master TAP selection code register for connection to said circuit TDO;

said master TAP having, for each said group:

a padding register having a length equal to the length of said master TAP instruction register less the length of the instruction register chain length of said group, an input connected to the circuit TDI, and an output;

a TDI multiplexer circuit responsive to a shift state signal for selectively connecting said group TDI to either said circuit TDI when a test data register of said group is to be accessed or to said output of said padding register when an instruction register in said group is to be accessed;

a TMS gating circuit responsive to a predetermined group selection code, a predetermined master TAP state signal and said circuit TMS signal for producing and applying a group TMS signal to the TMS input of each TAP in said group, said group TMS signal being the same as the circuit Test Mode Select signal when said current selection code corresponds to said predetermined group selection code or said master TAP is in a reset state, and, otherwise, said group TMS signal being inactive;

an update signal gating circuit responsive to said selection code for suppressing the update of all bits, except for the bits defining said group selection code, of said master TAP instruction register when the current selection code is other than the predetermined selection code associated with said master TAP and for updating said master TAP instruction register when said the current selection code corresponds to the predetermined group selection code associated with said master TAP;

a reset signal gating circuit responsive to a reset signal applied to the circuit test reset input for controlling the test reset input of said remaining TAPs for resetting said remaining TAPs when said master TAP is reset.

36. A circuit as defined in claim 35, further including gating logic means for loading a default selection code after a reset.

37. A circuit as defined in claim 36, wherein the default selection code is the predetermined selection code corresponding to that of the master TAP or any of the groups.

38. A circuit as defined in claim 35, said padding instruction register for each group including a portion of the instruction register of said master TAP.

39. A circuit as defined in claim 35, said padding instruction register for each group including memory elements associated with said master TAP and connected in series with the group TDI when an instruction is being loaded into the TAPs of said group.

40. A circuit as defined in claim 35, wherein the number of groups is two and the number of TAPs in each group is one.

41. A circuit as defined in claim 35, wherein each said TAPs being compliant with the IEEE 1149.1 Test Access Bus Architecture standard.

42. A circuit as defined in claim 35, where the resulting circuit is compliant to the IEEE 1149.1 Test Access Bus Architecture standard.

43. A circuit as defined in claim 35, wherein said TDI multiplexer further selecting between a bypass register and a padding instruction register, the bypass register being comprised of a single memory element connected between the circuit Test Data Input and said TDI multiplexer.

44. A circuit as defined in claim 35, wherein the length of each said padding register is at least two bits with the first two shift register elements thereof closest to said circuit TDO capture 0 and 1, respectively, during execution of a Capture-IR instruction.

45. A circuit as defined in claim 35, further including, for each test data register shared between two or more TAPs, said test data register having shift register elements responsive to one or more control signals, and having a serial input and a serial output, a first selector having an input for receiving serial input data from each of said two or more TAPS sharing said test data register;

a second selector having an input for receiving a register control signal bus from each of said two or more TAPS;

each said selector being responsive to a selection code indicative of the source of the serial data and control signal bus to be applied to said shared test data register, said serial output of said shared register being connected to all of said two or more TAPs of said circuit.

46. A method of controlling a circuit having a plurality of Test Access Port (TAP) interfaces in which one of said TAPs is connected to circuit test inputs and outputs and each said TAP interface includes a TAP Test Data Input (TDI), a TAP Test Data Output (TDO), a TAP Test Mode Select (TMS) input, a TAP clock input and a TAP reset input (TRSTN), an instruction register and at least one test data register, said TAPs being arranged into two or more groups of TAPs, each group having a group TDI and a group TDO and one or more TAPs serially connected there between, the method comprising:

(a) loading each test instruction into the instruction register of said one of said TAPs, each instruction including a group selection code specifying the TAP to be accessed in the next instruction;

(b) connecting the group TDO of the group having a predetermined TAP selection code corresponding to the TAP selection code stored in said instruction register to the TDO of said circuit;

(c) connecting the group TDI of all groups to the circuit TDI when accessing a test data register of a group;

(d) connecting the group TDI of all groups to a serial output of a respective padding register when an instruction register is to be accessed; and (e) applying a sufficient number of clock cycles to shift data into said test data register or an instruction into the instruction register of the specified TAP; and (f) repeating steps (a)–(f) for each additional data transfer operation.

47. A method as defined in claim 46, wherein step (c) includes connecting the TAP TDI of all TAPs to the circuit TDI in response to an inactive Shift-IR signal during a shift operation.

48. A method as defined in claim 46, wherein step (c) includes connecting the TAP TDI of all TAPs to the output of a bypass register having an input connected to the circuit TDI in response to an inactive Shift-IR signal during a shift operation.

49. A method as defined in claim 47, wherein step (d) includes connecting the TAP TDI of all TAPs to a serial output of respective padding registers in response to an active Shift-IR signal during a shift operation.

50. A method as defined in claim 46, wherein step (e) comprises applying a predetermined number of clock cycles for all instruction loading operations.

51. A program product for use in designing a circuit having a plurality of Test Access Port (TAP) interfaces, each TAP having a Test Data Input (TDI), a Test Data Output (TDO), a Test Mode Select (TMS) input, a Test Clock Input, a Test Reset input (TRSTN), an instruction register and at least one test data register, the program product comprising:

a computer readable storage medium;

means recorded on the medium for reading a circuit description of said circuit having a description of each said TAP;

means recorded on the medium for determining the instruction register bit length of the instruction register of each said TAP;

means recorded on the medium for inserting a description of a master TAP into a description of said circuit including:

connecting master TAP test ports to corresponding circuit test ports;

arranging said TAPs into at least two groups and serially connecting the TAPs in each group between a group TDI and a group TDO with the master TAP being the sole member of one of said groups;

for each group containing secondary TAPs:

connecting the group TDI of each group to a master TAP group TDI output for the group;

connecting the group TDO of each group to a master TAP group TDO input for the group;

determining the instruction register chain length of the group by summing the length of the instruction register bit length of each TAP in the group;

adding to the description of the master TAP:

a master TAP instruction register having a length equal to instruction register chain length of the group having the longest instruction register chain plus a predetermined number of bits forming a TAP selection code register for storing a group selection code for selecting one of the groups for data transfer;

a description of a TDO circuit receiving for input the TDO output of each group and an output connected to the circuit TDO and a select input receiving the group selection code for selectively connecting the group TDO of one of the groups to the circuit TDO; and for each group:

a description of a padding register having an input connected to a circuit TDI and an output connected to the group TDI of the group;

a description of a TMS circuit responsive to a predetermined group selection code for producing a group TMS; and a description of said TDI circuit responsive to a shift state signal for either connecting the circuit TDI to the group TDI or for connecting the output of said padding register to the group TDI.

* * * * *